United States Patent [19]

Takasu et al.

[11] 4,411,013
[45] Oct. 18, 1983

[54] SYSTEM FOR TRANSFERRING A FINE PATTERN ONTO A TARGET

[75] Inventors: Shinichiro Takasu, Tokyo; Toshiaki Shinozaki, Yokohama, both of Japan

[73] Assignee: Tokyo Shibaura Denki Kabushiki Kaisha, Kawasaki, Japan

[21] Appl. No.: 332,203

[22] Filed: Dec. 18, 1981

[30] Foreign Application Priority Data

Dec. 23, 1980 [JP] Japan .................................. 55-182348

[51] Int. Cl.³ .............................................. G21K 5/00
[52] U.S. Cl. .......................................... 378/34; 378/35
[58] Field of Search ................................... 378/34, 35

[56] References Cited
U.S. PATENT DOCUMENTS 4,088,896 5/1978 Elkins ..................................... 378/34

OTHER PUBLICATIONS

IEDM Technical Abstract (Washington D.C.) 1980, p. 415; W. D. Grobman; "Status of X-ray Lithography".

*Primary Examiner*—Craig E. Church
*Attorney, Agent, or Firm*—Oblon, Fisher, Spivak, McClelland & Maier

[57] ABSTRACT

An X-ray system for transferring a fine pattern onto a target has a mask, on the surface of which is formed an X-ray absorbing layer in a predetermined pattern and which is made of a single crystal of high regularity. Parallel monochromic X-rays become incident on the lattice plane of the single crystal at an angle $\theta$. Diffraction X-rays emerging from the lattice plane are projected onto the surface of a wafer in the normal direction. An X-ray resist layer is formed on the surface of the wafer. Since incident X-rays and diffraction X-rays are absorbed by the X-ray absorbing layer on the mask, the pattern defined by the layer is projected on the X-ray resist layer.

5 Claims, 5 Drawing Figures

SYSTEM FOR TRANSFERRING A FINE PATTERN ONTO A TARGET

BACKGROUND OF THE INVENTION

The present invention relates to a system for transferring a fine pattern onto a target and, more particularly, to an X-ray lithography system for transferring a fine pattern to a target, for example a Si wafer, with X-rays.

Recently, X-ray lithography systems have been developed as lithography systems which are capable of improving the resolution of the pattern transferred to a target. The conventional X-ray lithography system is described in IEDM Technical Abstract, 1980, p. 415 to p. 419, Warren D. Grobman, "Status of X-ray Lithography". In this conventional X-ray lithography system, X-rays emitted from an X-ray source are projected on a wafer having an X-ray resist layer through a mask on which is formed a predetermined pattern to be transferred from an X-ray absorber, so that the predetermined pattern is transferred to the wafer.

It is known that the conventional X-ray lithography systems have the problems to be described below. The substrate for the mask is required to be transparent to X-rays. In order to satisfy this requirement, the substrate must be formed to have a thickness of only several microns or less. It is difficult to manufacture such a thin substrate from the viewpoint of manufacturing precision. Since the X-ray source can not be considered as a point source in a rigorous definition and the X-rays diverge with a relatively large divergence angle, it is required to arrange the mask and the wafer must be as close as possible to form a transferred pattern of satisfactory resolution on the wafer. In the actual systems, the mask is in contact with the wafer. Therefore, since the substrate of the mask is very thin, the mask may be damaged.

SUMMARY OF THE INVENTION

It is an object of the present invention to provide an X-ray system for transferring a fine pattern onto a target wherein the manufacture of a mask is easy and damage to the mask is prevented.

In order to achieve the above object, there is provided according to the present invention an X-ray system for transferring a fine pattern onto a target, comprising a mask to which are directed X-rays, which is made of a single crystal material, and on which is formed, at the plane of incidence of the X-rays, a pattern of a material which prevents diffraction of the X-rays. The single crystal has a lattice plane (h,k,l). The X-rays diffracted by this lattice plate (h,k,l) are directed to the target. Since a pattern of a material which prevents diffraction of the X-rays is formed on the mask, this pattern is transferred to the target as a projected image.

DETAILED DESCRIPTION OF THE PREFERRED EMBODIMENTS

Figure 1:
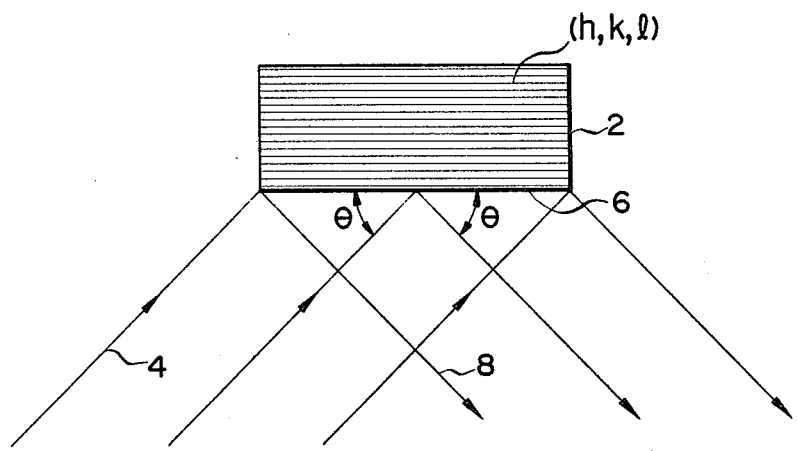
FIGS. 1 and 2 are schematic views showing the relationship between X-rays incident on a single crystal with a regular lattice plane (h,k,l) and X-rays diffracted by this lattice plane (h,k,l)
Figure 2:
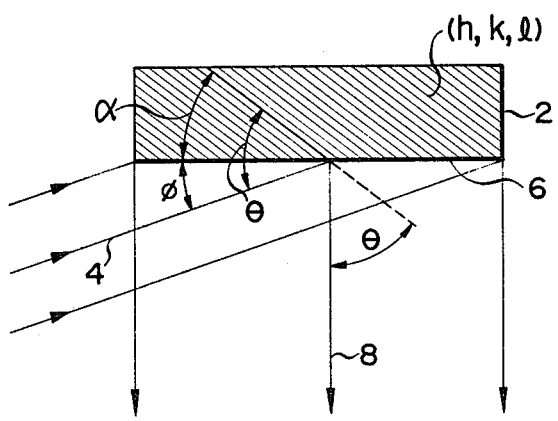

Before describing an X-ray system for transferring a fine pattern onto a target according to the present invention, the basic principle of the present invention will be described with reference to FIGS. 1 and 2. In general, when parallel beams of X-rays of wavelength $\lambda$ come incident on lattice planes or crystal planes (h,k,l) of a single crystal at an angle $\theta$, it is known as the Bragg's law that the X-rays are diffracted when the condition of equation (1) below is satisfied:

$$2d \cdot \sin \theta = \lambda \qquad (1)$$

where d is the crystal plane spacing.

Equation (1) above will be described in more detail with reference to FIG. 1. When parallel X-rays 4 of wavelength $\lambda$ come incident at angle $\theta$ on a surface 6 of a single crystal 2 having parallel lattice planes (h,k,l) with respect to the surface 6 of the crystal, diffraction X-rays 8 are produced under the condition of equation (1). These diffraction X-rays 8 travels in a regular reflecting direction with respect to the incident X-rays, that is, they form the angle $\theta$ with respect to the surface 6 of the single crystal 2. When the X-rays are diffracted by the single crystal of higher regularity, the divergence angle of the diffracted X-rays is very small. If these X-rays are further diffracted by a similar single crystal, the divergence angle may become about 5 seconds ($2.4 \times 10^{-5}$ radian). When silicon single crystal or the like is used, the divergence angle may be easily kept within 2 to 3 seconds.

The phenomenon described above also applies to lattice planes (h,k,l) which is inclined at the surface of the crystal. If the lattice planes (h,k,l) are inclined at an angle $\alpha$ with respect to the surface 6 of the single crystal 2 as shown in FIG. 2, when the X-rays 4 of the wavelength $\lambda$ come incident on the surface of the single crystal 2 at a predetermined angle $\phi$, the diffraction X-rays 8 satisfying relation (2) below are emitted:

$$2d \cdot \sin (\alpha + \phi) = \lambda \qquad (2)$$

Therefore, by directing the X-rays 4 of suitable wavelength $\lambda$ at the predetermined angle $\phi$ (where $\phi = \pi/2 - 2\alpha$) on the surface 6 of the single crystal 2, the diffraction X-rays 8 may be emitted in the vertical direction with respect to the surface 6 of the single crystal 2.

The present invention has been established based on this principle. According to the present invention, an X-ray absorber layer of a predetermined pattern is provided which absorbs incident X-rays and the diffraction X-rays on the surface 6 of the single crystal 2 having a predetermined orientation, whereby the single crystal 2 and the X-ray absorber layer provide a mask. The diffraction X-rays containing the pattern information which are diffracted by the mask are projected to the target, that is, an X-ray resist of the wafer, exposing the resist. Since the mask is not formed on a thin substrate as in the conventional case, and the mask is not formed close to or in contact with the wafer, damage to the mask is prevented and the manufacture of the mask is easy.

Figure 3:
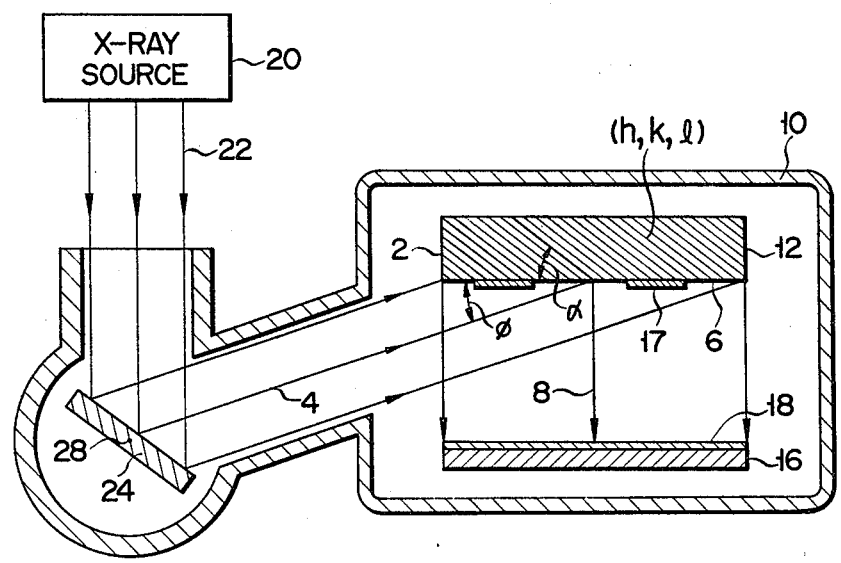
FIG. 3 is a schematic view showing an X-ray system for transferring a fine pattern onto a target according to an embodiment of the present invention.

An X-ray system according to an embodiment of the present invention will now be described with reference to FIGS. 3 to 5. As shown in FIG. 3, a mask 12 is arranged inside a housing 10 which is held vacuum-tight. A wafer 16 having an X-ray resist layer 18 formed thereon is arranged to oppose the mask 12. The mask 12 consists of a single crystal 2 of high regularity and an X-ray absorber layer 17 which defines a predetermined fine pattern on the surface 6 of the single crystal 2. The lattice planes (h,k,l) of the single crystal 2 are inclined at the angle α with respect to the surface 6 of the single crystal 2 as in the case of FIG. 2. An X-ray source 20 is similarly arranged inside the housing 10. X-rays 22 which are emitted by the X-ray source 20 are directed to a single crystal plate 24 for making them monochromatic. The monochromatic x-rays 4 having the wavelength λ which are diffracted by the single crystal plate 24 are directed to the mask 12 parallel to each other. In this embodiment, the surface of the single crystal plate 24 is inclined at a predetermined angle, so that the parallel monochromatic X-rays 4 become incident at an angle α on the surface of the mask 6. Since the lattice planes (h,k,l) of the single crystal 2 is inclined at the angle θ with respect to the surface 6 and at the angle $\theta = \alpha + \phi$ from equation (2) with respect to the incident X-rays, the monochromatic X-rays 4 are diffracted by the lattice planes (h,k,l) of the single crystal 2 of the mask 12 and the diffraction X-rays 8 are projected onto the x-ray resist layer 18 of the wafer 16 in the vertical direction, that is, the normal to the surface 6. These diffraction X-rays 18 contain the pattern information of the pattern which is defined by the X-ray absorber layer 17, so that the X-ray resist layer 18 is exposed in the corresponding pattern. Both the X-rays 4 which are incident on the X-ray absorber layer 17 of the mask 12 and the diffraction X-rays 8 which are diffracted by the lattice planes (h,k,l) of the single crystal 2 of the mask 12 are absorbed by the X-ray absorber layer 17. Therefore, the region of the x-ray resist layer 18 which corresponds to the layer 17 is not exposed to the diffraction X-rays 8. In contrast with this, the X-rays which become incident on the single crystal 2 without being absorbed by the X-ray absorber layer 17 and the diffraction X-rays 8 which are diffracted by the lattice planes (h,k,l) and which are not absorbed by the X-ray absorber layer 17 similarly are projected on the X-ray resist layer 18. In this manner, the pattern on the mask 12 is projected on the X-ray resist layer 18 on the wafer 16. As has been described above, the divergence of the diffraction X-rays 8 is very small. As a consequence, the pattern on the mask 12 is transferred on the X-ray resist layer 18 on the wafer 16 with sufficient resolution.

According to the present invention, the pattern is formed on the single crystal having a predetermined orientation. The monochromatic X-rays 4 emerging from the single crystal plate 24 are made to impinge on the mask 12. The diffraction X-rays 8 obtained from the mask 12 are radiated on the X-ray resist layer 18 formed on the wafer 16. Therefore, the pattern may be formed on the wafer 16 with sufficient resolution. Since diffraction X-rays are utilized in place of transmitted X-rays unlike in the case of the conventional systems, the mask 12 need not be formed thin. Accordingly, the manufacture of the mask 12 is easy, and the mechanical strength of the mask may be improved. Furthermore, since the divergence angle of the diffraction X-rays 8 is very small, the pattern may be transferred with good resolution even if the wafer 16 is located apart from the mask 10. Damage to the mask 12 is thus prevented.

Figure 4:
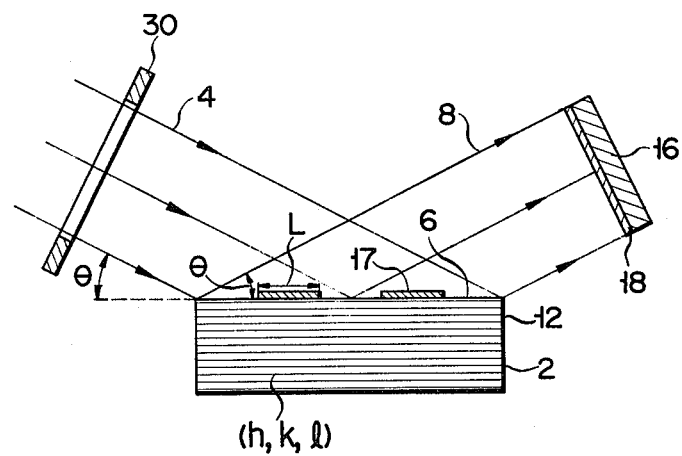
FIGS. 4 and 5 are schematic views showing an X-ray system for transferring a fine pattern onto a target according to another embodiment of the present invention.
Figure 5:
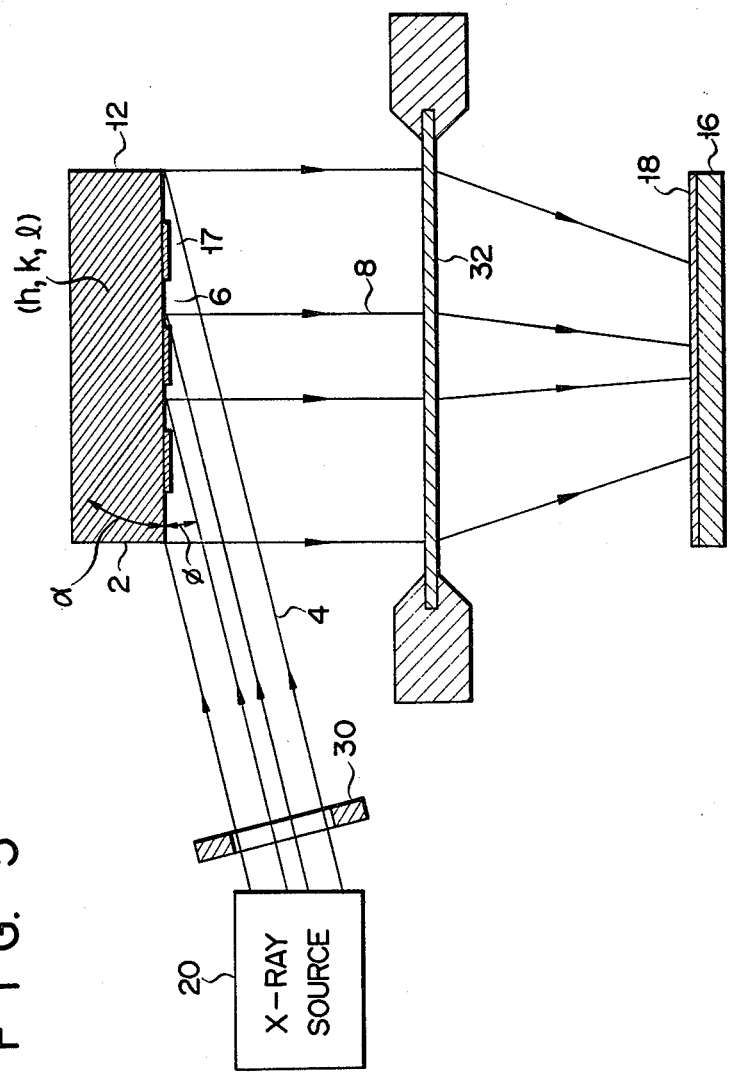

FIGS. 4 and 5 show systems for transferring the pattern in reduced scales. The same reference numerals as in FIGS. 1 to 3 denote the same parts, and the description thereof will be omitted. The single crystal 2 has the lattice planes (h,k,l) parallel to the surface 6 as shown in FIG. 1. Therefore, when the parallel monochromatic X-rays 4 are incident at the angle θ on the surface 6 of the single crystal 2, the diffraction X-rays 8 emerge from the surface 6 at the angle θ. The wafer 16 is so disposed that the surface of the X-ray resist layer 18 on the wafer 16 is perpendicular to the travelling path of the diffraction X-rays 8. A slit 30 is defined in the travelling path of the monochromatic X-rays 4 for limiting the size and shape of the beam of X-rays 4.

According to this embodiment, the diffraction X-rays 8 emerge from the regions of the mask 12 where the X-ray absorber layer 17 is not located to irradiate the resist layer on the wafer 16, thereby transferring the pattern on the wafer 16 as in the former embodiment. In this case, the width W in one direction of the pattern formed on the target is given by:

$$W = L \sin \theta$$

where θ is the angle of the diffraction X-rays 8 with respect to the surface of the mask 12, and L is the width of the X-ray absorber layer 17 defining the pattern. For example, if $\theta = 30°$ and 14.48°, $$W = L \sin 30° = 0.5 l$$

$$W = L \sin 14.48° = 0.25 l$$

In this manner, the pattern may be transferred in a reduced scale in a given direction. Therefore, in addition to the effects obtainable with the former embodiment, this embodiment is available for manufacture of diffraction gratings and graphoepitaxy base wires.

In the embodiment shown in FIG. 5, a Fresnel zone plate 32 for converging the diffraction X-rays 8 is arranged in the travelling path of the diffraction X-rays 8. Thus, the pattern on the mask 12 is reduced in scale by the Freznel zone plate 32 and is transferred to the X-ray resist layer 18 on the wafer 16 or on the target.

Although the present invention has been described with reference to the particular embodiments thereof, the present invention is not limited to this. For example, the crystal orientation of the single crystal of the mask, the wavelength λ, the angle of incidence θ of the X-rays on the mask, and so on, may be determined according to the specifications of the final products. Furthermore, although the x-rays which become incident on the mask are most preferably monochromatic X-rays, X-rays of many wavelengths may be used. The member for forming the pattern is not limited to the X-ray absorber, but must be one which does not produce the diffraction X-rays defined by equation (1) in response to the incident x-rays. Various changes and modifications may thus be made within the spirit and scope of the present invention.

In summary, according to the present invention, the pattern transfer may be performed with good resolution utilizing the diffraction of the x-rays, without using a thin mask and without arranging the mask close to the target. The present invention thus provides a fine pattern transferring system which renders the manufacture of the mask easy and which prevents damage to the mask.

What we claim is:

1. A system for transferring a fine pattern onto a target, comprising:
    means for emitting X-rays; and
    a mask on which are incident the X-rays at a predetermined angle and which emits diffraction X-rays, the mask including a single crystal having lattice planes of a predetermined orientation and a layer of a predetermined pattern which absorbs incident X-rays and diffraction X-rays, so that the diffraction X-rays which are not absorbed by the absorber layer are projected to the target and the pattern defined by the X-ray absorbing layer is transferred to the target.

2. A system according to claim 1, wherein the diffraction X-rays emerge from the lattice plane of the single crystal in the regular reflecting direction relative to the surface of the single crystal and come incident on the target.

3. A system according to claim 1, wherein the diffraction X-rays emerge from the lattice plane of the single crystal in the regular reflecting direction relative to the surface of the single crystal, the single crystal has a lattice plane such that the diffraction X-rays come incident on the target in the direction of the normal to the surface of the target, and a surface of the single crystal on which is formed the X-ray absorbing layer faces the target.

4. A system according to claim 3, wherein a Fresnel zone plate is arranged in a travelling path of the X-rays, so that the X-rays are focused, converged by the Fresnel zone plate to be projected on the target.

5. A system according to claim 1, wherein the X-ray emitting means includes an X-ray source for emitting X-rays and means for converting the X-rays into monochromatic X-rays.

* * * * *